(12) United States Patent
Kihara et al.

(10) Patent No.: US 10,444,869 B2
(45) Date of Patent: Oct. 15, 2019

(54) FLEXIBLE SUBSTRATE, PIEZOELECTRIC DEVICE, AND ELECTRONIC APPARATUS

(71) Applicant: Murata Manufacturing Co., Ltd., Nagaokakyo-shi, Kyoto-fu (JP)

(72) Inventors: Takashi Kihara, Nagaokakyo (JP); Yoshihiro Yamaguchi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 40 days.

(21) Appl. No.: 15/865,518

(22) Filed: Jan. 9, 2018

(65) Prior Publication Data
US 2018/0129315 A1    May 10, 2018

Related U.S. Application Data (63) Continuation of application No. PCT/JP2016/076379, filed on Sep. 8, 2016.

(30) Foreign Application Priority Data

Sep. 14, 2015 (JP) .................................. 2015-180697

(51) Int. Cl.
*G06F 3/0354* (2013.01)
*G06F 3/03* (2006.01)
(Continued)

(52) U.S. Cl.
CPC ............ *G06F 3/03545* (2013.01); *G06F 3/03* (2013.01); *H01L 41/047* (2013.01);
(Continued)

(58) Field of Classification Search
CPC .... G06F 3/03545; G06F 3/03; H01L 41/1132; H01L 41/0475; H01L 41/113; H01L 41/047; H01L 41/193
See application file for complete search history.

(56) References Cited

U.S. PATENT DOCUMENTS

| | | |
|---|---|---|
| 8,363,863 B2 | 1/2013 | Andoh et al. |
| 9,128,553 B2 | 9/2015 | Andoh |
| | (Continued) | |

FOREIGN PATENT DOCUMENTS

| | | |
|---|---|---|
| JP | 2015-58722 A | 5/1996 |
| JP | H08-116140 A | 5/1996 |
| | (Continued) | |

OTHER PUBLICATIONS

International Search Report issued in International Application No. PCT/JP2016/076379, dated Nov. 8, 2016.
(Continued)

*Primary Examiner* — Premal R Patel
(74) *Attorney, Agent, or Firm* — Arent Fox LLP (57) ABSTRACT

A flexible substrate that is curved in a first direction, an insulator disposed on the substrate, a first electrode disposed on a first main surface side of the insulator in a first formation region, and a second electrode also disposed on the first main surface side of the insulator in a second formation region. A non-formation region is defined between the first electrode and the second electrode on the first main surface, and the non-formation region has at least a portion thereof extending along a direction different from a second direction orthogonal to the first direction.

6 Claims, 5 Drawing Sheets

(51) Int. Cl.
  *H01L 41/047* (2006.01)
  *H01L 41/113* (2006.01)
  *H01L 41/193* (2006.01)

(52) U.S. Cl.
  CPC ........ *H01L 41/0475* (2013.01); *H01L 41/113* (2013.01); *H01L 41/1132* (2013.01); *H01L 41/193* (2013.01)

(56) References Cited

U.S. PATENT DOCUMENTS

| | | | |
|---|---|---|---|
| 9,134,826 | B2 | 9/2015 | Andoh |
| 9,383,884 | B2 | 7/2016 | Andoh |
| 9,627,605 | B2 | 4/2017 | Ando et al. |
| 9,804,725 | B2 | 10/2017 | Andoh |
| 2011/0128245 | A1 | 6/2011 | Andoh et al. |
| 2012/0075226 | A1 | 3/2012 | Andoh |
| 2013/0106796 | A1* | 5/2013 | Yilmaz ................. G06F 3/0383 345/179 |
| 2013/0328817 | A1 | 12/2013 | Andoh |
| 2014/0049137 | A1 | 2/2014 | Ando et al. |
| 2015/0054782 | A1* | 2/2015 | Liu ......................... G06F 3/044 345/174 |
| 2015/0153880 | A1 | 6/2015 | Andoh |
| 2016/0034073 | A1 | 2/2016 | Andoh |
| 2017/0186939 | A1 | 6/2017 | Ando et al. |
| 2018/0018050 | A1 | 1/2018 | Andoh |

FOREIGN PATENT DOCUMENTS

| | | |
|---|---|---|
| JP | 2012-209841 A | 2/2014 |
| JP | 2014-26449 A | 2/2014 |
| WO | WO 2009/144964 A1 | 12/2009 |
| WO | WO 2010/143528 A1 | 12/2010 |

OTHER PUBLICATIONS

Written Opinion of the International Searching Authority issued in International Application No. PCT/JP2016/076379, dated Nov. 8, 2016.

* cited by examiner

FLEXIBLE SUBSTRATE, PIEZOELECTRIC DEVICE, AND ELECTRONIC APPARATUS

CROSS REFERENCE TO RELATED APPLICATIONS

The present application is a continuation of International application No. PCT/JP2016/076379, filed Sep. 8, 2016, which claims priority to Japanese Patent Application No. 2015-180697, filed Sep. 14, 2015, the entire contents of each of which are incorporated herein by reference.

FIELD OF THE INVENTION

The present invention relates to a flexible substrate having a flexible base material, a piezoelectric device including the flexible substrate, and an electronic apparatus including the piezoelectric device.

BACKGROUND OF THE INVENTION

As an electronic device having a flexible base material, there has been disclosed a flexible substrate as in Patent Document 1.

The flexible substrate of Patent Document 1 has a structure in which copper foil is formed on the rear surface and the copper foil at a bent portion is removed. As a result, the portion from which the copper foil has been removed becomes more flexible than the surroundings, so that it can be easily bent.

Patent Document 1: Japanese Patent Application Laid-Open No. H8-116140

SUMMARY OF THE INVENTION

In a structure in which copper foil is formed on the rear surface as in the flexible substrate of Patent Document 1, it is common to apply an insulating layer such as a resist to the copper foil.

However, in the copper foil formation part and the copper foil non-formation part, a step is generated by the thickness of the copper foil. There has thus been a possibility that stress concentrates on the step portion when the flexible substrate is bent.

Accordingly, an object of the present invention is to provide a flexible substrate, a piezoelectric device, and an electronic apparatus that prevent the stress from concentrating on a specific portion.

A flexible substrate of an aspect of the present invention is curved in a first direction; an insulator is disposed on the substrate; a first electrode is disposed on a first main surface side of the insulator in a first formation region, and a second electrode is disposed on the first main surface side of the insulator in a second formation region so as to define a non-formation region between the first electrode and the second electrode. The non-formation region has at least a portion thereof extending along a direction different from a second direction orthogonal to the first direction.

If the non-formation region is formed along the second direction orthogonal to the first direction when the flexible substrate is curved in the first direction, the stress concentrates and an insulating layer such as a resist may peel off or cracking may occur. However, the flexible substrate of the present invention has a portion where the non-formation region extends along a direction different from the second direction, so that the stress is dispersed and the possibility that the insulating layer peels off or cracking occurs can be reduced.

In particular, it is preferable that adjacent portions of the first electrode and the second electrode (i.e., the non-formation region) have a comb-like shape in a plan view. By the non-formation region having a comb-like shape, it is possible to lengthen a portion (the comb-like electrode portion) where the stress is dispersed, and it is easy to adjust the shape.

Further, it is more preferable that positions of respective ends of the comb-like portions in the first electrode and the second electrode be shifted in the first direction. It is thereby possible to further disperse the stress.

According to the present invention, it is possible to prevent the stress from concentrating on a specific portion.

DETAILED DESCRIPTION OF THE INVENTION

Figure 1:
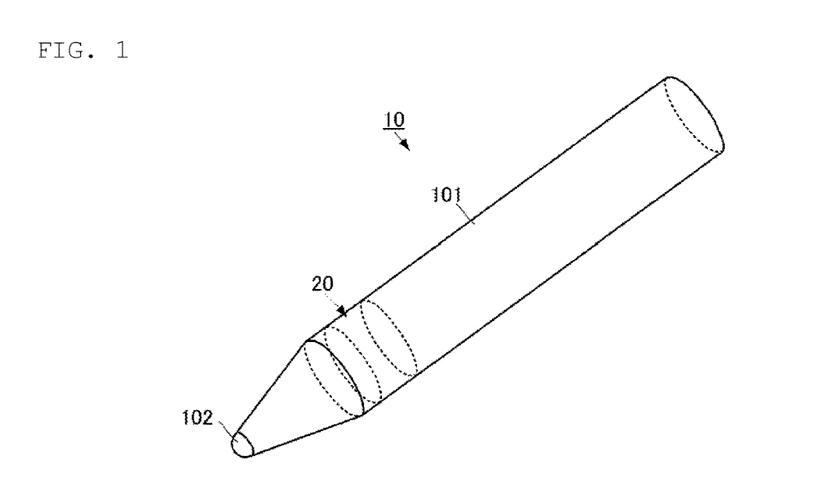
FIG. 1 is a perspective view of an electronic writing instrument.
Figure 2:
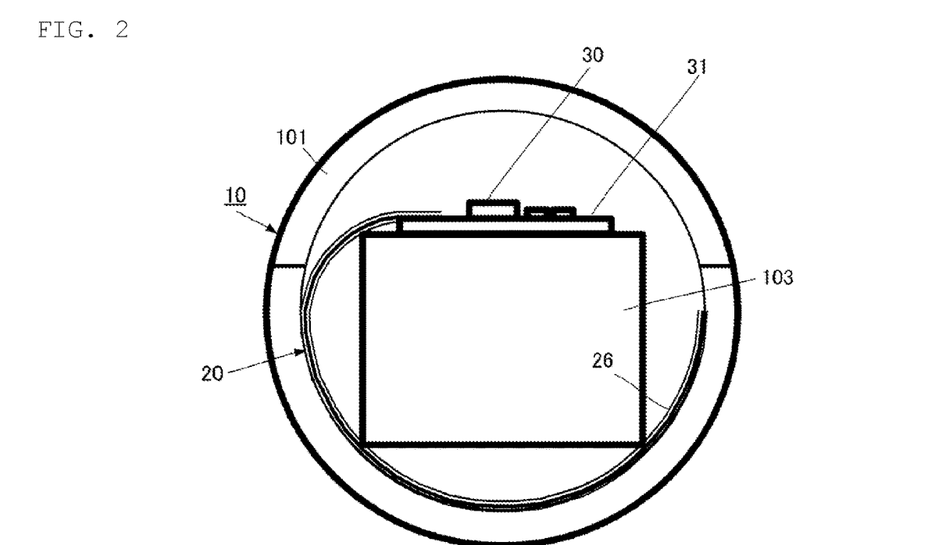
FIG. 2 is a sectional view of the electronic writing instrument.
Figure 3:
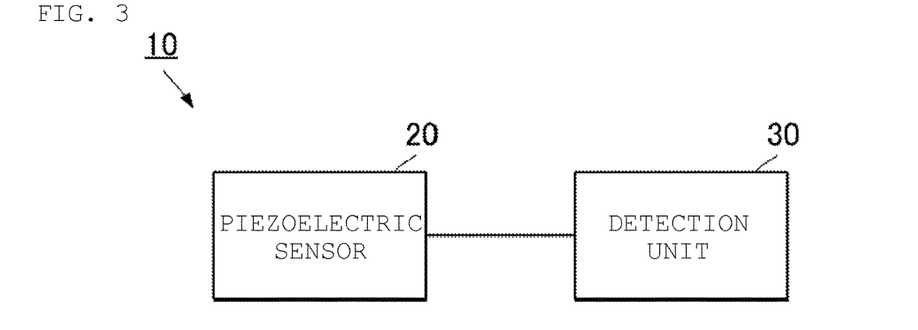
FIG. 3 is a functional block diagram of the electronic writing instrument.

FIG. 1 is a perspective view of an electronic writing instrument 10 according to an embodiment of the present invention. FIG. 2 is a sectional view of the electronic writing instrument 10 shown in FIG. 1. FIG. 2 is a sectional view of a region where a piezoelectric sensor 20 is attached to the electronic writing instrument 10. FIG. 3 is a functional block diagram of the electronic writing instrument 10 shown in FIG. 1.

As shown in FIG. 1, the electronic writing instrument 10 includes a piezoelectric sensor 20 and a housing 101. Further, as shown in FIGS. 2 and 3, the electronic writing instrument 10 includes a detection unit 30.

The electronic writing instrument 10 is an example of an electronic apparatus, and the piezoelectric sensor 20 is an example of a piezoelectric device.

The housing 101 has a cylindrical shape. The housing 101 is made of an insulating material. A support 103 is provided inside the housing 101 as shown in FIG. 2. At one end of the housing 101 in a longitudinal direction (a direction orthogonal to a circumferential direction), an end 102 having a tapered shape is provided as shown in FIG. 1.

Note that the housing 101 may have a strength (rigidity) to the extent that its deformation can be transmitted to the piezoelectric sensor 20, and the housing 101 may be made of metal.

The piezoelectric sensor 20 includes a base material 26 having flexibility. As shown in FIG. 2, the base material 26 is attached to the inner wall surface of the housing 101 in a curved state along the circumferential direction of the inner wall surface of the housing 101. Therefore, at each portion of the piezoelectric sensor 20, stress is generated due to bending of the base material 26.

The detection unit 30 is connected to the piezoelectric sensor 20. The detection unit 30 is attached to the support 103. The detection unit 30 detects an output voltage of the piezoelectric sensor 20 and detects whether or not the housing 101 is held by the user.

Figure 4A:
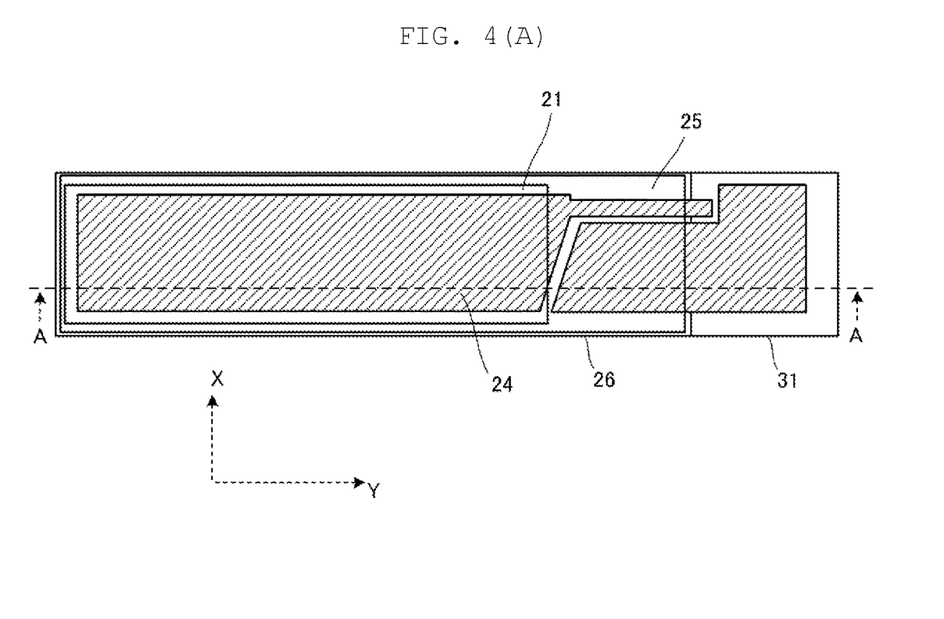
FIG. 4(A) is a partially transparent plan view.
Figure 4B:
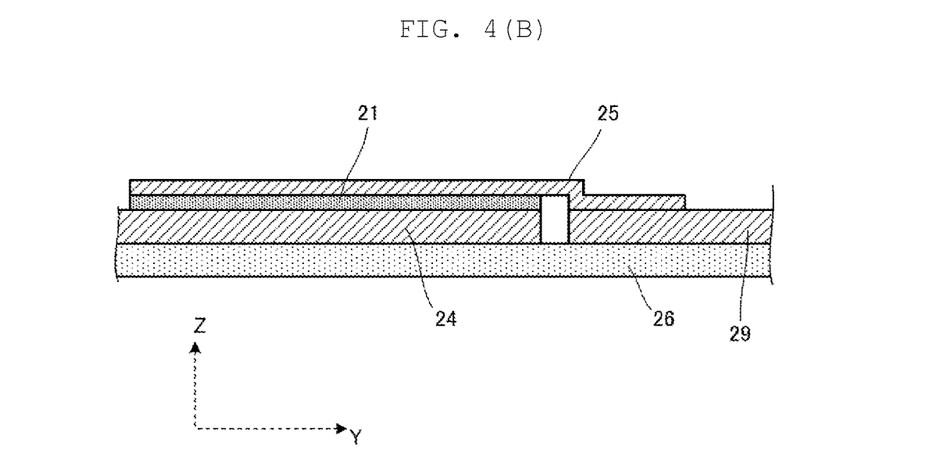
FIG. 4(B) is a sectional view.
Figure 5:
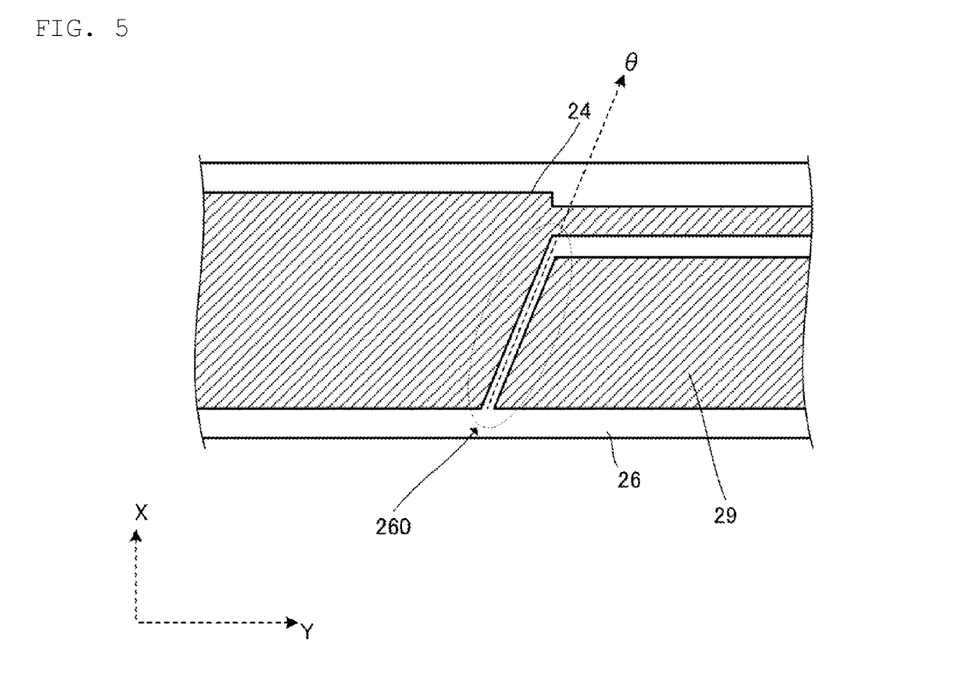
FIG. 5 is a plan view of a state where a piezoelectric film 21 and a third electrode 25 have been removed from a piezoelectric sensor 20 of FIG. 4(A).

Hereinafter, details of the piezoelectric sensor 20 will be described. FIG. 4(A) is a plan view of the piezoelectric sensor 20. However, in FIG. 4(A), a piezoelectric film 21 and a third electrode 25 are displayed as transparent. FIG. 4(B) is a sectional view taken along line A-A in FIG. 4(A). FIG. 5 is a plan view of a state where the piezoelectric film 21 and the third electrode 25 have been removed from the plan view of the piezoelectric sensor 20 shown in FIG. 4(A).

The piezoelectric sensor 20 includes the piezoelectric film 21, a first electrode 24, a second electrode 29, the third electrode 25, and the base material 26.

The base material 26 has flexibility. The material for the base material 26 is, for example, a polyimide resin, a liquid crystal polymer film, a PET film, or the like. A first electrode 24 and a second electrode 29 are formed on the surface of the base material 26.

The base material 26, the first electrode 24, and the second electrode 29 constitute a flexible substrate (flexible printed wiring board). The first electrode 24, the second electrode 29, and the third electrode 25 are made of a metal film such as copper foil.

The piezoelectric film 21 has a first main surface and a second main surface. The first electrode 24 has a wide part 241 connected to the first main surface of the piezoelectric film 21 and a narrow part 242 connected to the wide part 241. The first main surface of the piezoelectric film 21 is bonded to the wide part 241 with an adhesive (not shown) interposed therebetween.

On the other hand, a third electrode 25 is bonded to the second main surface of the piezoelectric film 21 with an adhesive (not shown) interposed therebetween. The third electrode 25 is a film-like electrode and is bonded so as to cover the second main surface of the piezoelectric film 21. The second electrode 29 is electrically connected to the third electrode 25.

The first electrode 24 and the second electrode 29 are electrically connected to various electrodes on the substrate 31 on which the detection unit 30 is provided and are electrically connected to the detection unit 30. In this example, the second electrode 29 and the third electrode are ground electrodes, and the first electrode 24 serves as a signal electrode for detecting electric charge generated in the piezoelectric film 21.

The material for the piezoelectric film 21 is, for example, PLLA (L-type polylactic acid). PLLA is a chiral polymer, and its main chain has a helical structure. PLLA has piezoelectricity when PLLA is uniaxially stretched and molecules are oriented. A piezoelectric constant of uniaxially stretched PLLA belongs to a group of very high piezoelectric constants among polymers.

Further, PLLA generates piezoelectricity as a result of molecule orientation processing by stretching or the like, and does not require polling processing unlike other polymers such as polyvinylidene fluoride (PVDF) or piezoelectric ceramics. That is, the piezoelectricity of PLLA not belonging to ferroelectrics is exhibited not by ion polarization as in ferroelectrics such as PVDF or lead zirconate titanate (PZT), but derives from a helical structure which is a characteristic structure of molecules.

Hence, PLLA does not exhibit pyroelectricity that is generated by other ferroelectric piezoelectric bodies. The piezoelectric constant of PVDF or the like temporally fluctuates and remarkably decreases depending on cases, whereas the piezoelectric constant of PLLA is temporally very stable.

Assuming that PLLA has three axes in an extending direction and one axis and two axes in a direction perpendicular to a triaxial direction, PLLA has piezoelectric constant d14 (shear piezoelectric constant). The piezoelectric film 21 in a stripe shape is cut out so that one axial direction is a thickness direction and a direction forming an angle of 45° with respect to the triaxial direction (extending direction) is the longitudinal direction. As a result, when the piezoelectric film 21 extends and contracts in the longitudinal direction, the piezoelectric film 21 is polarized in the thickness direction.

In the above configuration, as shown in FIG. 5, on the upper surface of the base material 26, a formation region where the first electrode 24 and the second electrode 29 are formed and a non-formation region 260 adjacent to the first electrode 24 and the second electrode 29 are present. The non-formation region 260 extends along a direction different from a second direction (X direction) orthogonal to a first direction (Y direction) in which the base material 26 is curved.

Figure 6:
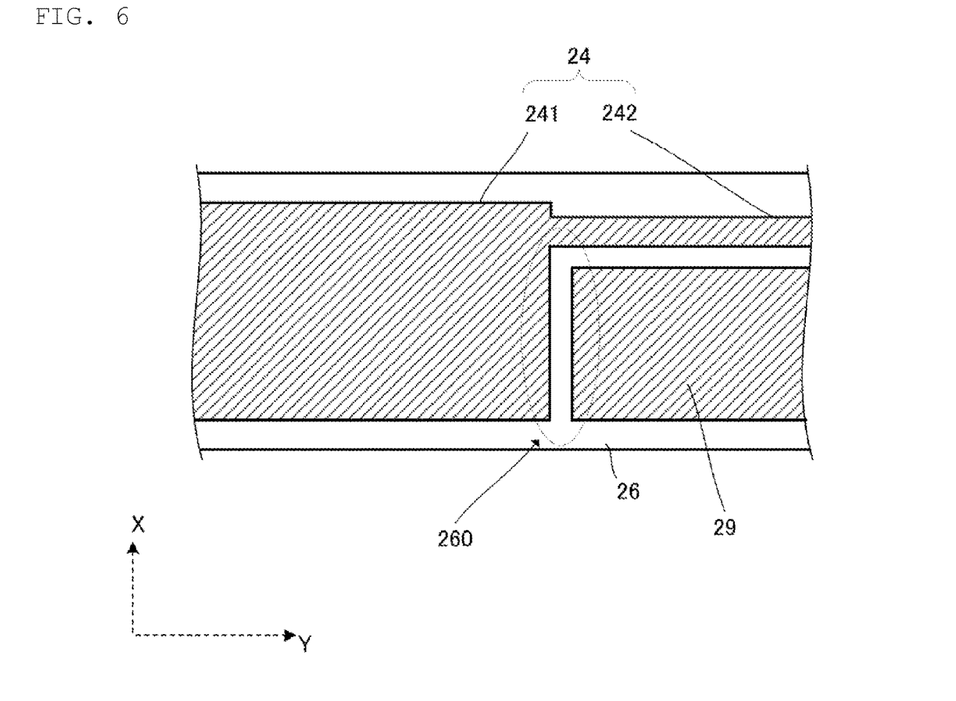
FIG. 6 is a plan view showing a conventional example.

That is, as shown in FIG. 6, if the non-formation region 260 is formed along the X direction when the base material 26 is curved in the Y direction, the thickness of the non-formation region 260 is smaller than the thickness of the formation region, and hence the stress concentrates and an insulating layer, such as a resist, may peel off or cracking may occur.

However, in the base material 26 of the present embodiment, the non-formation region 260 extends along a direction different from the X direction. In the example of FIG. 5, the non-formation region 260 extends along a θ direction inclined at approximately 20° toward the Y direction with respect to the X direction. Therefore, when the base material 26 is curved in the Y direction, the stress does not concentrate on the non-formation region 260, which can reduce the possibility that the insulating layer peels off or cracking occurs. Note that the non-formation region 260 may extend in a direction inclined at about −20° toward the Y direction with respect to the X direction.

Figure 7:
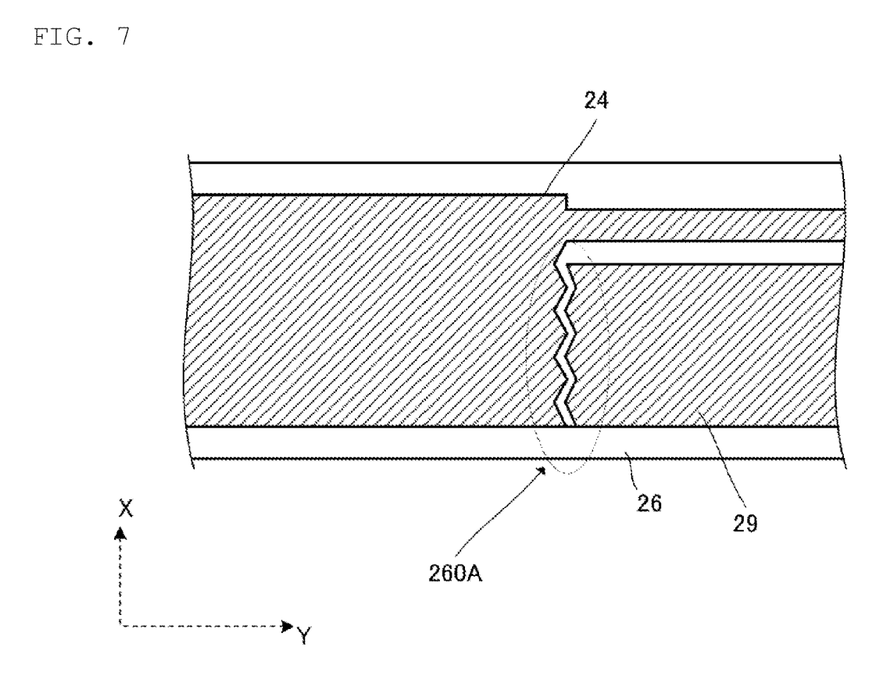
FIG. 7 is a plan view of a piezoelectric sensor 20 according to a first modification.

Next, FIG. 7 is a plan view (a plan view in a state where the piezoelectric film 21 and the third electrode 25 have been removed) of the piezoelectric sensor 20 according to a first modification. Also in a non-formation region 260A in this first modification, the non-formation region 260 extends along a direction different from the X direction. That is, the non-formation region 260A has a portion extending along a direction inclined at about 20° toward the Y direction with respect to the X direction and a portion extending along a direction inclined at about −20° toward the Y direction with respect to the X direction.

Accordingly, even if the base material 26 is bent so as to be twisted, the number of portions extending along the direction orthogonal to the bending direction is reduced in the non-formation region 260A, which can reduce the possibility that the insulating layer peels off or cracking occurs.

Figure 8:
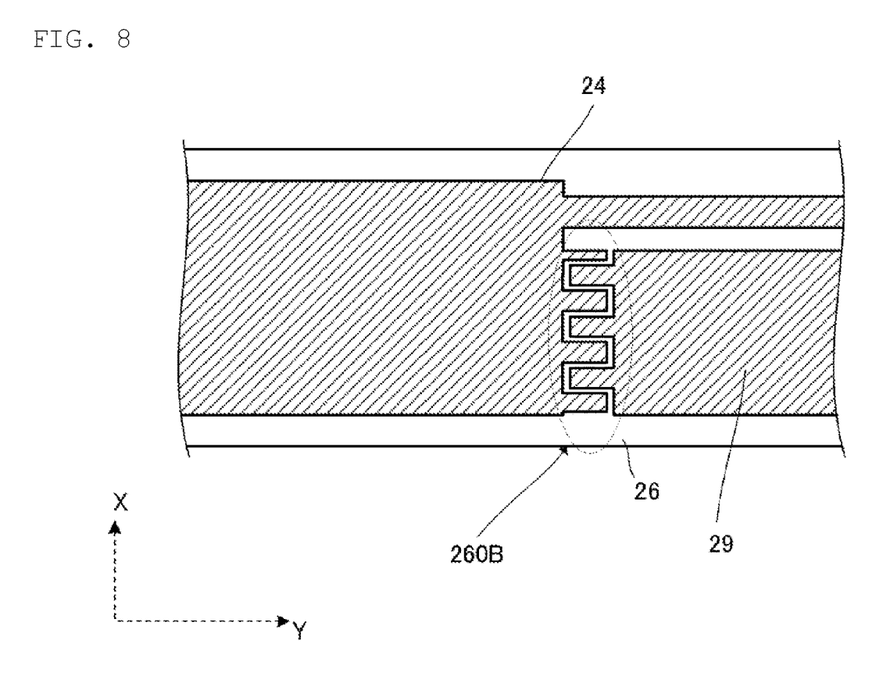
FIG. 8 is a plan view of a piezoelectric sensor 20 according to a second modification.

Next, FIG. 8 is a plan view (a plan view in a state where the piezoelectric film 21 and the third electrode 25 have been removed) of the piezoelectric sensor 20 according to a second modification. A non-formation region 260B in the second modification also has a portion extending along a direction different from the X direction.

In this example, adjacent portions of the first electrode 24 and the second electrode 29 have a comb-like shape in a plan view. Thereby, the non-formation region 260B has a portion extending along the X direction and a portion extending along the Y direction.

As compared to the example shown in FIG. 6, the non-formation region 260B also has fewer portions extending along the X direction. Thus, when the base material 26 is curved in the Y direction, the stress does not concentrate on the non-formation region 260B, which can reduce the possibility that the insulating layer peels off or cracking occurs. In addition, although the non-formation region of FIG. 7 has a portion protruding in the Y direction, since the non-formation region 260B is flat, the influence on the bonded member and the base material 26 is reduced when the base material 26 is bent in the Y direction.

Figure 9:
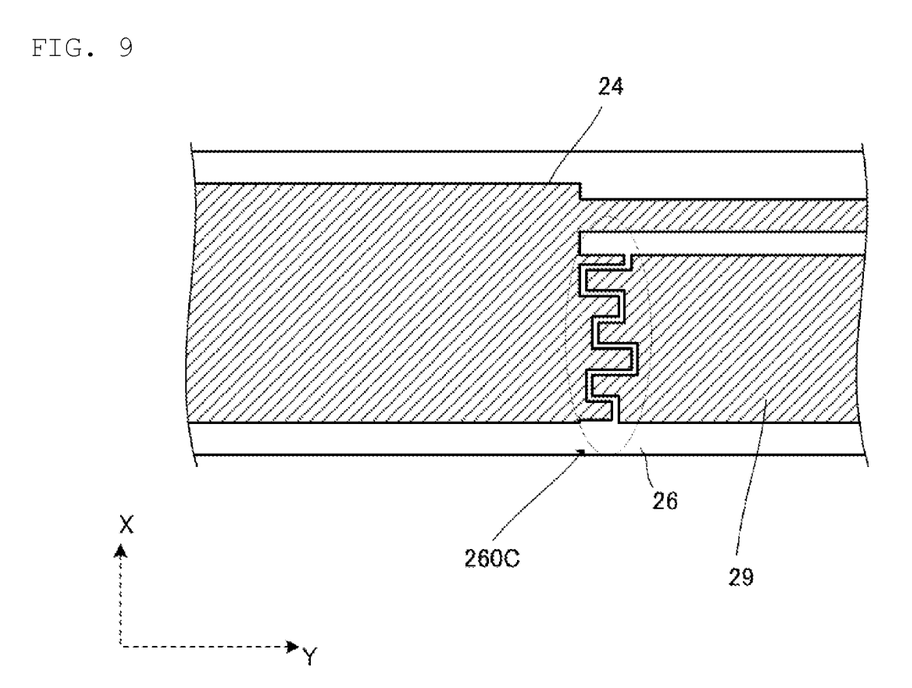
FIG. 9 is a plan view of a piezoelectric sensor 20 according to a third modification.

Next, FIG. 9 is a plan view of the piezoelectric sensor 20 according to a third modification (a plan view in a state where the piezoelectric film 21 and the third electrode 25 have been removed). A non-formation region 260C in the third modification also has a portion extending along a direction different from the X direction.

Also in the third modification, adjacent portions of the first electrode 24 and the second electrode 29 have a comb-like shape in a plan view. Thereby, the non-formation region 260C has a portion extending along the X direction and a portion extending along the Y direction.

Further, in the third modification, the positions of the ends of the comb-like portions of the first electrode 24 and the second electrode 29 are shifted in the Y direction. Hence, among the non-formation regions 260C, the respective portions extending along the X direction are shifted in the Y direction.

Accordingly, the non-formation region 260C can further prevent concentration of the stress, as compared to the example shown in FIG. 8. Needless to say, also in the example shown in FIG. 7, the positions of the respective ends of the non-formation region 260A may be shifted in the Y direction.

In the above-described embodiment, the electronic writing instrument 10 has been shown as the example of the electronic apparatus to be attached to the housing in a state where the base material is curved, but the present invention is not limited to this example.

In practice, it can be applied to other electronic apparatuses such as a mouse, a tablet terminal, and a smart phone.

Further, in the present embodiment, the piezoelectric sensor 20 has been shown as the example of the piezoelectric device, but the present invention is not limited thereto. For example, it can be applied to a piezoelectric actuator as an example of the piezoelectric device. Moreover, in this embodiment, a piezoelectric film has been shown as the example of the insulator, but for example, as long as it is a flexible substrate (e.g., a capacitor) provided with a dielectric and a plurality of electrodes, the configuration of the present invention can be applied.

Further, as shown in FIG. 2, the detection unit 30 is mounted inside the housing 101, but the present invention is not limited thereto. The detection unit 30 may be disposed outside the housing 101. In the mode in which the piezoelectric sensor 20 and the detection unit 30 are disposed outside the housing 101, the piezoelectric sensor 20 and the detection unit 30 may be wired or wirelessly connected.

Further, in the above-described embodiment, the example in which the piezoelectric film 21 of polylactic acid is used for the piezoelectric sensor 20 has been shown, but the present invention is not limited thereto. In practice, it is possible to use another piezoelectric film such as PVDF.

In the present embodiment, the third electrode 25, which is the ground electrode, is disposed on the upper surface of the piezoelectric film 21 and is electrically connected to the second electrode 29 formed on the upper surface of the base material 26. However, the arrangement of the ground electrodes is not limited to this example. For example, the ground electrode may be disposed on the lower surface of the base material 26. In this case, since each main surface of the first electrode is covered with the ground electrode, the influence of external noises can be reduced.

Moreover, in the present embodiment, various modes have been described concerning the shape of the non-formation region in the adjacent portions of the first electrode 24 which is the signal electrode and the second electrode 29 which is the ground electrode. However, for example when a plurality of signal electrodes are provided on the same plane, the shapes of various non-formation regions described above can also be employed for the adjacent portion between these signal electrodes.

Further, in FIGS. 8 and 9, the end of the comb-like portion has a rectangular shape, but the corner of this end may have a circular arc shape. In this case, it is possible to prevent the stress from concentrating at the corner.

DESCRIPTION OF REFERENCE SYMBOLS

10: electronic writing instrument
20: piezoelectric sensor
21: piezoelectric film
24: first electrode
29: second electrode
25: third electrode
26: base material
30: detection unit
31: substrate
50: cover lay
101: housing
102: end
103: support
241: wide part
242: narrow part
260, 260A, 260B, 260C: non-formation region

The invention claimed is:

1. A piezoelectric device comprising:
a substrate curved in a first direction;
a piezoelectric body disposed on the substrate;
a piezoelectric detection electrode disposed on a first main surface side of the piezoelectric body in a first formation region;
a ground electrode disposed on the first main surface side of the piezoelectric body in a second formation region different from the first formation region so as to define a non-formation region between the piezoelectric detection electrode and the ground electrode; and
a third electrode is disposed on a second main surface side of the piezoelectric body,
wherein the non-formation region has at least a portion thereof extending along a direction different from a second direction orthogonal to the first direction, and
the second electrode is electrically connected to the third electrode.

2. The piezoelectric device according to claim 1, wherein the non-formation region has a comb-like shape in a plan view of the flexible substrate.

3. The piezoelectric device according to claim 2, wherein positions of respective ends of the comb-like shape of the non-formation region are shifted in the first direction.

4. The piezoelectric device according to claim 1, wherein an entirety of the non-formation region extends at an angle relative to the first direction.

5. The piezoelectric device according to claim 1, wherein the portion of the non-formation region extends at an angle relative to the first direction.

6. An electronic apparatus comprising
the piezoelectric device according to claim 1,
wherein the base material is attached to an inner wall surface of a curved housing.

* * * * *